US010732029B2

(12) United States Patent
Stone et al.

(10) Patent No.: US 10,732,029 B2
(45) Date of Patent: *Aug. 4, 2020

(54) DIAGNOSTIC WAVEGUIDE FOR OPTICAL CHIP TESTING

(71) Applicant: Skorpios Technologies, Inc., Albuquerque, NM (US)

(72) Inventors: Robert J. Stone, Berkeley, CA (US); Stephen B. Krasulick, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/178,840

(22) Filed: Nov. 2, 2018

(65) Prior Publication Data
US 2019/0170572 A1    Jun. 6, 2019

Related U.S. Application Data

(63) Continuation of application No. 14/964,144, filed on Dec. 9, 2015, now Pat. No. 10,151,627, which is a (Continued)

(51) Int. Cl.
*G01J 1/08*        (2006.01)
*G01R 31/3187*     (2006.01)
(Continued)

(52) U.S. Cl.
CPC .   *G01J 1/08* (2013.01); *G01J 1/42* (2013.01); *G01R 31/3187* (2013.01);
(Continued)

(58) Field of Classification Search
CPC .......... G01J 1/08; G01J 1/42; G01J 2001/083; G01J 2001/4247; G01R 31/3187;
(Continued)

(56) References Cited

U.S. PATENT DOCUMENTS 4,730,330 A    3/1988  Plihal et al.
5,347,601 A *  9/1994  Ade .................... G02B 6/12004
                                                      385/14
(Continued)

FOREIGN PATENT DOCUMENTS

JP         56-105948 U    8/1981
JP       1986-269110 A   11/1986
(Continued)

OTHER PUBLICATIONS

Analui et al., "A Fully integrated 20-Gb/s Optoelectronic Transceiver Implemented in a Standard 0.13-mu-m CMOS SOI Technology"; IEEE Journal of Solid State Circuits; vol. 41, No. 12; Dec. 2006; [Retrieved on Jan. 6, 2014, http://ieeexplore.ieee.org/xpls/abs_all.jsp?arnumber=4014595&tag=1 ]; 11 pages.
(Continued)

*Primary Examiner* — Vinh P Nguyen
(74) *Attorney, Agent, or Firm* — Kilpatrick Townsend & Stockton LLP

(57) ABSTRACT

A photonics system includes a transmit photonics module and a receive photonics module. The photonics system also includes a transmit waveguide coupled to the transmit photonics module, a first optical switch integrated with the transmit waveguide, and a diagnostics waveguide optically coupled to the first optical switch. The photonics system further includes a receive waveguide coupled to the receive photonics module and a second optical switch integrated with the receive waveguide and optically coupled to the diagnostics waveguide.

20 Claims, 3 Drawing Sheets

Related U.S. Application Data continuation of application No. 13/959,166, filed on Aug. 5, 2013, now Pat. No. 9,236,958.

(60) Provisional application No. 61/682,122, filed on Aug. 10, 2012.

(51) Int. Cl.
| | |
|---|---|
| *H04B 10/073* | (2013.01) |
| *H04B 10/035* | (2013.01) |
| *H04B 10/077* | (2013.01) |
| *H04B 17/00* | (2015.01) |
| *G01J 1/42* | (2006.01) |

(52) U.S. Cl.
CPC ....... *H04B 10/035* (2013.01); *H04B 10/0731* (2013.01); *H04B 10/0779* (2013.01); *H04B 17/0082* (2013.01); *G01J 2001/083* (2013.01); *G01J 2001/4247* (2013.01)

(58) Field of Classification Search
CPC ............ G01R 31/2635; G01R 31/2849; G01R 31/311; G01R 31/31728; G01R 31/31905; G01R 35/00; H04B 10/035; H04B 10/0731; H04B 10/0779; H04B 17/0082; H04B 17/00; H04B 17/0027; H04B 17/19; H04J 14/02; H04J 14/06; H04Q 2011/0035; G02F 1/011
See application file for complete search history.

(56) References Cited

U.S. PATENT DOCUMENTS

| | | | |
|---|---|---|---|
| 5,821,529 A | 10/1998 | Chihara et al. | |
| 6,266,996 B1 | 7/2001 | Livingston | |
| 6,586,953 B1* | 7/2003 | Okayasu | G01R 31/311 324/750.15 |
| 6,822,743 B2 | 11/2004 | Trinh | |
| 7,949,260 B2* | 5/2011 | Fukuchi | H04B 10/677 356/460 |
| 9,236,958 B2 | 1/2016 | Stone | |
| 10,151,627 B2 | 12/2018 | Stone et al. | |
| 2004/0105611 A1 | 6/2004 | Bischel et al. | |
| 2008/0043240 A1 | 2/2008 | Reminiac | |
| 2008/0192255 A1 | 8/2008 | Burk | |
| 2009/0022500 A1 | 1/2009 | Pinguet et al. | |
| 2011/0076025 A1 | 3/2011 | Shimura | |
| 2011/0279109 A1* | 11/2011 | Masuda | G01R 31/31917 324/96 |
| 2012/0170931 A1 | 7/2012 | Evans et al. | |
| 2014/0043050 A1 | 2/2014 | Stone et al. | |

FOREIGN PATENT DOCUMENTS

| | | |
|---|---|---|
| JP | 05060651 A | 3/1993 |
| JP | 10107739 A | 4/1998 |
| JP | 2004/219386 A | 8/2004 |
| JP | 2006/241516 A | 9/2006 |
| JP | 2009-505457 A | 2/2009 |
| JP | 2009-098693 A | 5/2009 |
| JP | 2011-081115 A | 4/2011 |
| JP | 2011-107384 A | 6/2011 |
| JP | 2011-242208 A | 12/2011 |
| JP | 2015-526653 A | 9/2015 |
| JP | 2015-533259 A | 11/2015 |
| JP | 6328635 B2 | 5/2019 |
| WO | 2007/002288 A2 | 1/2007 |
| WO | 2010/080157 A1 | 7/2010 |
| WO | 2014/025824 A2 | 2/2014 |

OTHER PUBLICATIONS

Extended European Search Report dated Mar. 2, 2016 for International Application No. EP-13828603.4-1874; 10 pages.
IPRP dated Feb. 19, 2015 for International Patent Application No. PCT/US2013/053856 filed on Aug. 6, 2013, all pages.
Notification of Transmittal of the International Search Report and the Written opinion of the International Searching Authority, or the Declaration; ISR/WO of the International Searching Authority for International Application No. PCT/US2013/053856 dated Jan. 29, 2014; 8 pages.
JP Application No. 2015-526653 filed Aug. 6, 2013, received a Notice of Allowance dated Mar. 20, 2018, 3 pages.
English translation of Office Action dated Jul. 11, 2017 for Japanese Patent Application No. 2015-526653; all pages.
JP Application No. 2018-080362, Office Action dated May 5, 2019, all pages.
EP13828603.4 received an Office Action dated Oct. 10, 2019, 6 pages.

* cited by examiner

DIAGNOSTIC WAVEGUIDE FOR OPTICAL CHIP TESTING

CROSS-REFERENCES TO RELATED APPLICATIONS

This application is a continuation of U.S. patent application Ser. No. 14/964,144, filed on Dec. 9, 2015, entitled "Method and System for Performing Testing of Photonic Devices," now U.S. Pat. No. 10,151,267, which application is a continuation of U.S. patent application Ser. No. 13/959,166, filed on Aug. 5, 2013, entitled "Method and System for Performing Testing of Photonic Devices," now U.S. Pat. No. 9,236,958, issued on Jan. 12, 2016, which application claims priority to U.S. Provisional Patent Application No. 61/682,122, filed on Aug. 10, 2012, entitled "Method and System for Performing Testing of Photonic Devices," the disclosures of which are hereby incorporated by reference in their entirety for all purposes.

SUMMARY OF THE INVENTION

Embodiments of the present invention relate to photonic devices. More particularly, embodiments of the present invention relate to an apparatus and method for testing, including self-testing, of photonic devices. As an example, optical self-diagnostics can be performed for photonic devices.

According to an embodiment of the present invention, a photonics system is provided. The photonics system includes a transmit photonics module and a receive photonics module. The photonics system also includes a transmit waveguide coupled to the transmit photonics module, a first optical switch integrated with the transmit waveguide, and a diagnostics waveguide optically coupled to the first optical switch. The photonics system further includes a receive waveguide coupled to the receive photonics module and a second optical switch integrated with the receive waveguide and optically coupled to the diagnostics waveguide.

According to another embodiment of the present invention, a method of performing testing of a photonic device is provided. The method includes generating a test pattern and generating an optical signal associated with the test pattern. The method also includes transmitting the optical signal through a transmit waveguide and coupling at least a portion of the optical signal into a diagnostics waveguide to provide a diagnostics signal. The method further includes coupling at least a portion of the diagnostics signal into a receive waveguide and testing the diagnostics signal.

Embodiments of the present invention relate to photonic devices. More particularly, embodiments of the present invention relate to an apparatus and method for testing, including self-testing, of photonic devices.

Numerous benefits are achieved by way of the present invention over conventional techniques. For example, embodiments of the present invention provide method and systems that enable on-wafer testing, reduction in testing time (resulting in cost reduction during manufacturing), self-calibration, automatic configuration of the optical circuits, built in self-test capability and on-board diagnostics, and the like. These and other embodiments of the invention along with many of its advantages and features are described in more detail in conjunction with the text below and attached figures.

DETAILED DESCRIPTION OF SPECIFIC EMBODIMENTS

Figure 1:
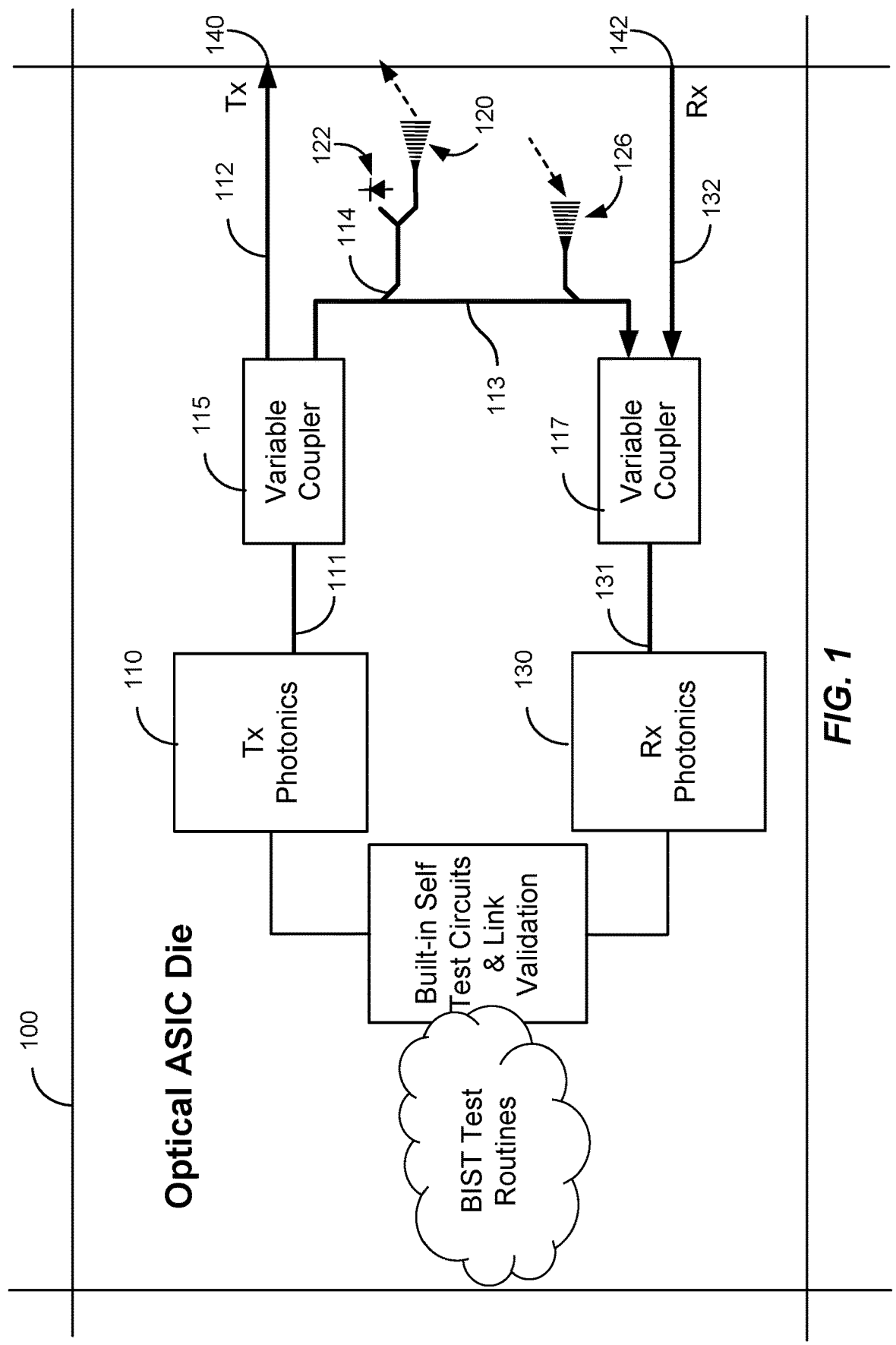
FIG. 1 is a simplified schematic diagram illustrating a system for performing self-test of a photonic circuit.

FIG. 1 is a simplified schematic diagram illustrating a system for performing self-test of a photonic circuit. The photonic design illustrated can be tested in a variety of configurations as described herein. As illustrated in FIG. 1, embodiments of the present invention provide for optical self-test of devices including, but not limited to, photonic modules, photonic transceivers with transmit and receive ports, reconfigurable optical add drop multiplexers (ROADM), optical switches, amplifiers, filters, and the like. As illustrated in FIG. 1, a portion of a processed substrate is illustrated in the form of a Optical ASIC 100 in undiced, die form. Though not shown in the figure, adjacent dies are present on one or more sides of the illustrated die. Because the die is still in undiced form, optical testing using the transmit and receive ports is unavailable. Embodiments of the present invention provide functionality not available using conventional photonic transceivers that have a transmit port and a receive port, typically formed on the edge of the diced or cleaved die. For such conventional transceivers, access to the transmit and receive ports is used to perform external loop-back testing of the transceiver, thereby requiring the transceiver to be in die format.

Embodiments of the present invention provide wafer level testing that is enabled by Built In Self-Test & Auto Calibration functionality. Various performance characteristics can be calibrated according to embodiments of the present invention, for example, the wavelength of the light in the transmit path. As described herein, light can be directed off the chip using the (out of plane, e.g., surface normal) coupler to provide the light to a wavelength test tool. In some embodiments, diagnostic elements are integrated on-chip, enabling both measurement and adjustment of the parameters on-chip. As an example, the power can be monitored using a detector and the feedback loop including the Built-in Self-Test Circuits and Link Validation module can be used to adjust the power of the Tx photonics. Thus, the fabrication and operation of on-chip as well as the operation of off-chip measurement devices are included within the scope of the present invention.

Utilizing embodiments of the present invention, it is possible to perform electrical testing of transceiver functionality at the wafer level, including both Tx and Rx functionality without the use of external fiber optic cables. Additionally, during the operational lifetime of the transceiver, the integrity of the transceiver can be tested using on-chip components to provide module health monitoring.

As an example, embodiments of the present invention provide for the on-chip generation of test patterns using the feedback loop between the Rx photonics 130 and the Tx photonics 110. Calibration is not limited to the Tx photonics, but can also be applied to the Rx photonics. Software in the BIST Test Routines can be used in conjunction with the self-test circuits to calibrate optical devices, for example, providing control of the modulation format. Thus, signals generated on the chip can be used to drive the Tx photonics and measure the Rx photonics. Additionally, wafer level probing of the transmit and/or receive photonics can be utilized. Moreover, combinations of on-chip and probe testing can be utilized as appropriate to the particular test protocol. One of ordinary skill in the art would recognize many variations, modifications, and alternatives. As an example, test patterns can be generated externally and then applied to the Tx photonics. Alternatively, test patterns can be generated on-chip with no or a reduced external input. The test patterns can be read using the Rx photonics to characterize, for example, transceiver performance.

Embodiments of the present invention use variable couplers (e.g., optical switches) to enable optical loopback. As shown in FIG. 1, light emitted by the transmit (i.e., Tx) photonics module 110 initially propagates in transmit waveguide 111 and, during self-test, is redirected by the variable coupler 115 from the transmit waveguide 111 into the on-chip optical loopback waveguide 113, also referred to as a diagnostics waveguide. As described herein, light from the transmit waveguide 111 can be coupled into the on-chip optical loopback waveguide 113 using variable coupler 115 and directed into the receive (i.e., Rx) photonics 130 by using variable coupler 117. The on-chip optical loopback waveguide 113 is an element of a diagnostic loop linking the Tx photonics and Rx photonics to enable wafer level testing.

During operation of the device (after dicing and packaging), light passes through the terminal portion 112 of transmit waveguide and is emitted at the Tx port 140, where it is typically coupled into a fiber. Likewise, during operation, light is received at the Rx port 142, typically from a fiber and coupled into the terminal portion 132 of the receive waveguide 131. After dicing and packaging, loopback testing can be performed by coupling a fiber to both the Tx and Rx ports. However, in the undiced state with conventional transceivers, because there is no optical access to the Tx and Rx ports, such loopback testing using an external fiber is not possible. Accordingly, embodiments of the present invention provide a mechanism to feed the signal from the transmit waveguide 111 into the receive waveguide 131, enabling loopback testing. The integration of the self-test functionality with the transceiver enables wafer scale testing (e.g., loopback testing) prior to dicing as well as testing during operation (i.e., after dicing and packaging).

In applications where optical elements are integrated onto the optical ASIC wafer, it is not typically possible to test the optical elements after integration and before dicing and packaging. Embodiments of the present invention enable fully electrical and optical testing of the integrated optical elements at the wafer scale using the diagnostic loop described herein. Prior to wafer dicing, loopback testing can be performed, the transmit power can be measured, other characteristics of the transmit signal can be measured using a suitable detector and associated electronics, or light can be output using a surface coupler, providing an optical input to a wide variety of test equipment. Accordingly, dies with performance below a predetermined threshold can be identified, improving yield in advance of dicing and packaging operations.

Figure 2A:
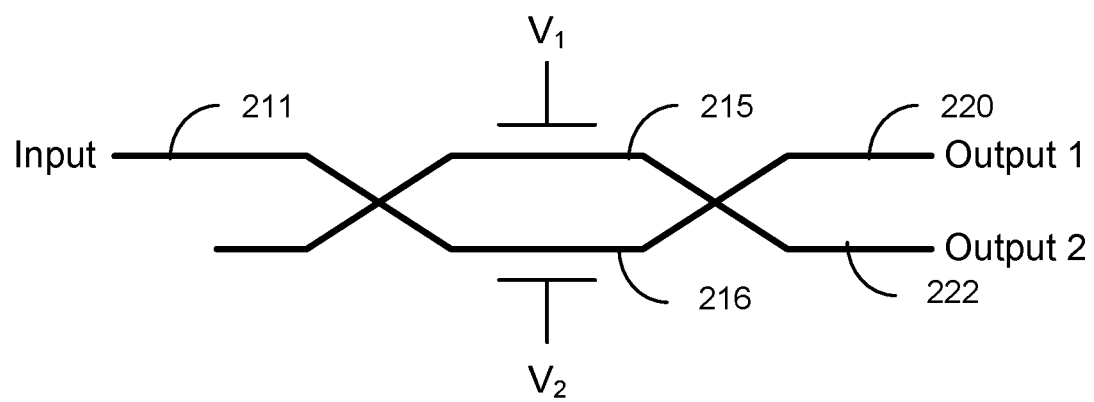
FIG. 2A is a simplified schematic diagram illustrating a Mach-Zehnder interferometer acting as a variable coupler according to an embodiment of the present invention.

FIG. 2A is a simplified schematic diagram illustrating a Mach-Zehnder interferometer acting as a variable coupler according to an embodiment of the present invention. The Mach-Zehnder interferometer 210 receives an input at input waveguide 211 (e.g., from transmit waveguide 111) and splits the signal into two interferometer arms 215 and 216. Bias, represented by voltages $V_1$ and $V_2$ are applied to one or more of the two arms, resulting in coupling of light into either Output 1 (220) or Output 2 (222), or partially into each output. Bias to control the phase of the light in the arms of the Mach-Zehnder interferometer can be provided using heaters, diodes for phase control, or the like. Other contacts could also be added to perform similar functions. Based the bias in the arms, represented by $V_1$ and $V_2$, the input light is variably switched between outputs depending on applied signals. One of ordinary skill in the art would recognize many variations, modifications, and alternatives.

Figure 2B:
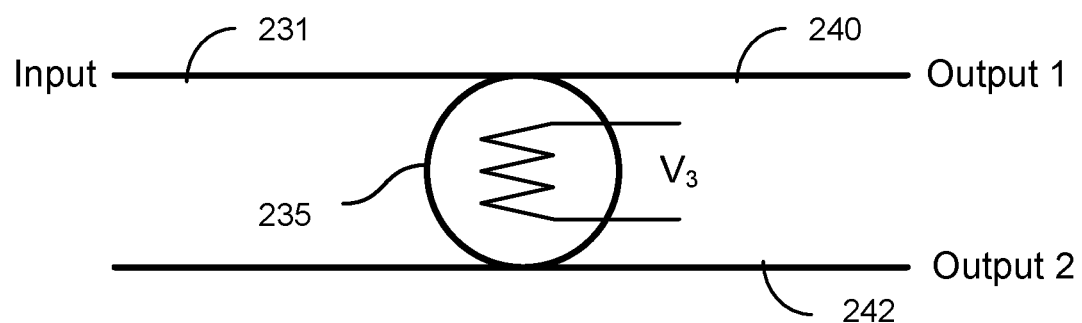
FIG. 2B is a simplified schematic diagram illustrating a resonant ring interferometer acting as a variable coupler according to an embodiment of the present invention.

FIG. 2B is a simplified schematic diagram illustrating a resonant ring interferometer acting as a variable coupler according to an embodiment of the present invention. For this variable coupler, light is received at input waveguide 231 and coupled into resonant ring 235. Application of bias, represented by voltage $V_3$ controls the optical resonance wavelength of coupling between the input and the outputs, thereby selectively directing the output light to Output 1 (240) or Output 2 (242). In the embodiment illustrated in FIG. 2B, the bias control is through a heater, but this could also be a diode-based phase control element. In addition to the variable couplers illustrated in FIGS. 2A and 2B, other variable couplers are included within the scope of the present invention and these particular examples are not intended to limit the scope of the invention.

The optical path including the transmit waveguide 111, the on-chip optical loopback waveguide 113, and the receive waveguide 131 as illustrated in FIG. 1 enables a self-test mode in which loopback testing can be performed. The variable couplers 115 and 117 can be electrically actuated, thermally actuated, or the like.

The variable coupler 115 integrated into the transmit path enables a portion or all of the light in the transmit path to be switched into the diagnostic loop, i.e., the loop including loopback waveguide 113. Thus, light can be partially coupled to the Tx port 140 and partially coupled into the loopback waveguide 112.

One or more taps can be provided in the diagnostic loop as illustrated in FIG. 1 to enable integration of detectors (e.g., a power monitor) to measure the power in the diagnostic loop, which can be calibrated to determine the power in the transmit waveguide and the power that exits at the Tx port. Referring to FIG. 1, tap 114 directs light into a waveguide with a branching coupler to reach either a transmit signal monitor 122 or an out-of-plane coupler 120. The transmit signal monitor is illustrated in FIG. 1 as a photodetector (e.g., integrated on-chip) to provide data on the optical power in the transmit waveguide. In addition to power measurements, the transmit signal monitor 122 can provide information on wavelength, spectral characteristics, compliance with modulation or communication standards, a high speed receiver, other diagnostic elements, or the like. Electrical outputs from the transmit power monitor can be provided to enable electrical connection to off-chip diagnostic equipment during wafer-scale testing. Thus, a variety of different diagnostic systems can be utilized to characterize the optical signal propagating in the transmit waveguide 111.

In an embodiment, the out-of-plane coupler 120 is a surface normal coupler, for example, a grating coupler, operable to direct the light in a direction substantially normal to the surface of the optical ASIC die, but this is not required by the present invention since directions other than normal can be utilized. Thus, grating couplers operating at other than normal incidence are included within the scope of the present invention. The out-of-plane coupler 120 is integrated with tap 114 to provide a mechanism to direct optical power in a direction substantially vertical (or other suitable angle with respect to the wafer), providing an output that can be used as an optical pickup to measure the power in the diagnostic loop, characteristics of the transmit signal, such as frequency, wavelength, error patterns, test patterns, or the like. Using the out-of-plane coupler 120, characterization of the Tx photonics can be performed, measuring a variety of metrics associated with the transmitter portion of the transceiver, including bit rates, error rates, eye-diagrams, and the like. Thus, embodiments of the present invention provide for signal monitoring using integrated optical elements like the on-chip transmit signal monitor 122 or off-chip sensors, which can be provided with optical inputs using one or more out-of-plane couplers 120.

The present invention is not limited to the optical monitoring functionality illustrated by the power monitor, but can include a variety of diagnostic tools and systems.

As illustrated in FIG. 1, an additional out-of-plane coupler 126 (e.g., a grating coupler operating at normal or other angle of incidence) can be used to receive optical injection into the on-chip optical loopback waveguide 113 from off-chip. In the illustrated embodiment, the light received at the chip, which can then be used, for example, to calibrate or test the Rx photonics, is coupled into the diagnostic loop using a tap and then directed into the receive waveguide 131 using variable coupler 117. In addition to receiving light through the optical coupler and transmitting it to the diagnostic waveguide, the received light could be coupled into the receive waveguide, either before or after the variable coupler, using additional out-of-plane couplers (not shown), for example coupled at a location along receive waveguide 131 between the variable coupler 117 and the Rx photonics 130 or at a location along the terminal portion 132 of the receive waveguide. One of ordinary skill in the art would recognize many variations, modifications, and alternatives. In some testing protocols, an external fiber loop is used to receive light from out-of-plane coupler 120 and direct light into out-of-plane coupler 126, effectively mimicking the loopback testing typically performed by coupling a fiber loop to the Tx port 140 and the Rx port 142 of a diced device. In either external testing or loopback implementations, the testing protocols can include reference test signals, test patterns, or the like.

One example of an off-wafer optical pickup that can be used in conjunction with the out-of-plane couplers is diagnostics used for precise DWDM BOL calibrations. Examples of surface couplers include grating surface emitters, an angled facet, or the like.

Figure 3:
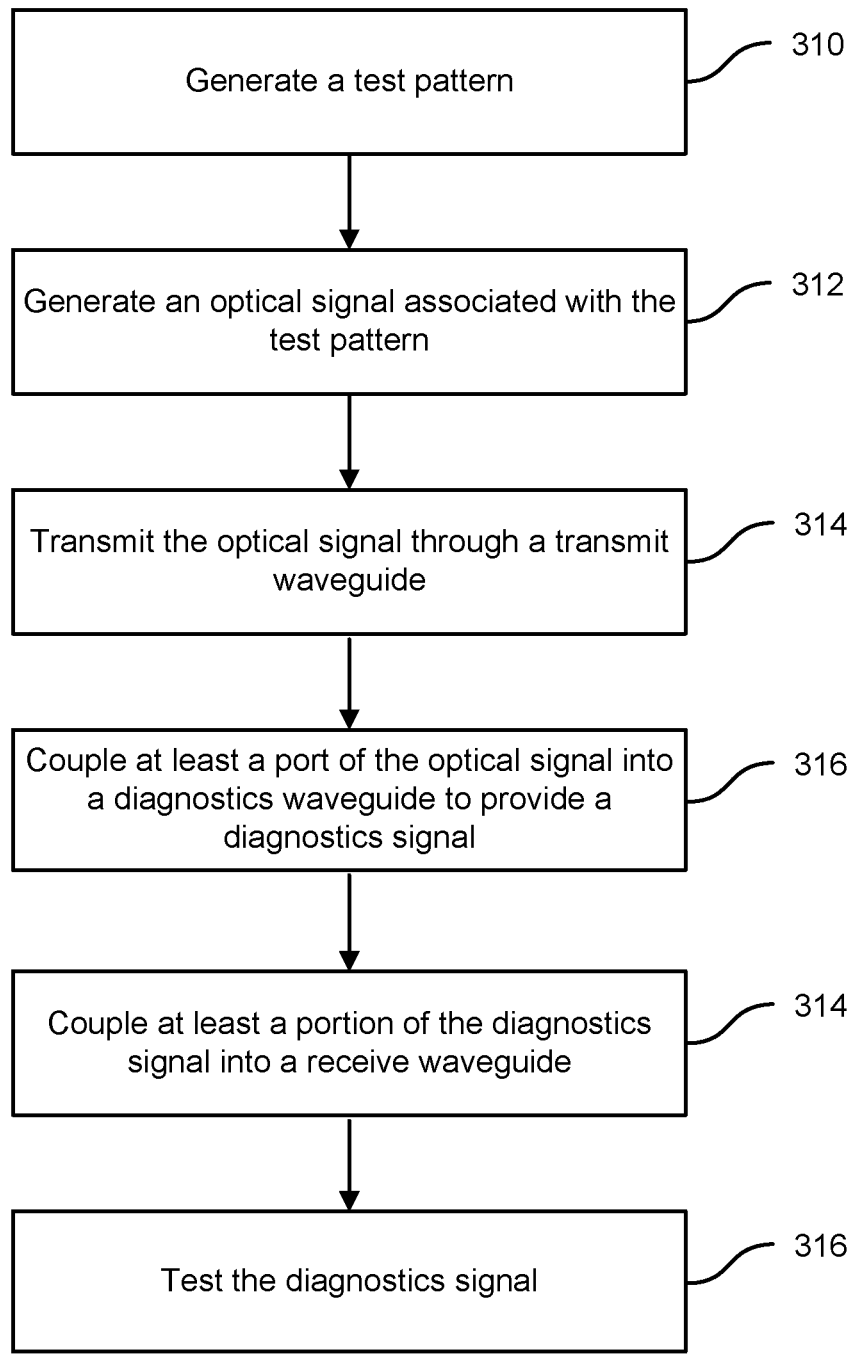
FIG. 3 is a simplified flowchart illustrating a method of performing testing of a photonic device according to an embodiment of the present invention.

FIG. 3 is a simplified flowchart illustrating a method of performing testing of a photonic device according to an embodiment of the present invention. The method includes generating a test pattern (310), generating an optical signal associated with the test pattern (312), and transmitting the optical signal through a transmit waveguide (314). In an embodiment, the transmit waveguide is a portion of an undiced wafer, providing no transmit port available for testing of the Tx photonics.

The method also includes coupling at least a portion of the optical signal into a diagnostics waveguide to provide a diagnostics signal (316), coupling the diagnostics signal into a receive waveguide (318) and testing the diagnostics signal (320). The test pattern can be generating using on-chip circuits or can be generated by probing Tx photonics, or combinations thereof.

According to some embodiments, coupling at least a portion of the optical signal into the diagnostics waveguide comprises coupling light through a variable coupler using electrical or thermal actuation. Additionally, the method can include tapping the at least a portion of the optical signal and measuring a power associated with the at least a portion of the optical signal. The power can be measured using a detector and associated electronics, which can be integrated on-chip. Moreover, the method can include tapping the at least a portion of the optical signal and coupling some of the optical signal off of the photonic device, for example, using a surface coupler.

In addition to transmitting signals off of the chip prior to dicing, off-chip optical signals can be received, a portion of the off-chip optical signal can be coupled into the receive waveguide, and the portion of the off-chip optical signal can be received using Rx photonics. Testing can include detecting the diagnostics signal and analyzing at least one of signal to noise ratio, error detection, signal bandwidth, optical frequency, optical wavelength, and the like.

It should be appreciated that the specific steps illustrated in FIG. 3 provide a particular method of testing a photonic device according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for optical communication, the system comprising:
   a chip;
   a transmitter, wherein:
      the transmitter is on the chip; and
      the transmitter generates light;
   a receiver, wherein:
      the receiver is on the chip; and
      the receiver is an optical receiver; and
   a diagnostics waveguide, wherein:
      the diagnostics waveguide is on the chip; and
      the diagnostics waveguide optically couples light from the transmitter with the receiver.

2. The system of claim 1, further comprising a photodetector integrated on the chip and optically coupled with the transmitter.

3. The system of claim 2, further comprising a tap that couples the photodetector with the diagnostics waveguide, such that the photodetector is optically coupled with the transmitter.

4. The system of claim 2, wherein the photodetector provides data on optical power, wavelength, spectral characteristics, and/or compliance with modulation or communication standards of light generated by the transmitter.

5. The system of claim 1, wherein the chip is part of an undiced wafer.

6. The system of claim 1, further comprising:
   a transmit waveguide, wherein:
      the transmit waveguide is on the chip; and
      the transmit waveguide is coupled with the transmitter; and a receive waveguide, wherein:
- the receive waveguide is on the chip;
- the receive waveguide is coupled with the receiver; and
- the diagnostics waveguide optically couples light from the transmitter with the receiver by optically coupling the transmit waveguide with the receive waveguide.

7. The system of claim 6, further comprising a variable coupler between the transmit waveguide and the diagnostics waveguide.

8. The system of claim 7, wherein the variable coupler is a Mach-Zehnder interferometer.

9. The system of claim 1, further comprising an out-of-plane coupler optically coupled with the diagnostics waveguide.

10. A method for testing optical communication, the method comprising:
- generating an optical signal using a transmitter, wherein the transmitter is on a chip;
- coupling at least a part of the optical signal into a diagnostics waveguide to provide a diagnostics signal, wherein the diagnostics waveguide is on the chip;
- transmitting the diagnostics signal through the diagnostics waveguide; and
- receiving the diagnostics signal at a receiver, wherein:
  - the receiver is an optical receiver; and
  - the receiver is on the chip.

11. The method of claim 10, further comprising coupling light into a photodetector on the chip.

12. The method of claim 11, wherein a tap is used to couple at least a portion of the diagnostics signal from the diagnostics waveguide with the photodetector.

13. The method of claim 11, further comprising receiving from the photodetector data on optical power, wavelength, spectral characteristics, and/or compliance with modulation or communication standards of light generated by the transmitter.

14. The method of claim 10, wherein the chip is part of a wafer that is undiced, and the method further comprises dicing the wafer after receiving the diagnostics signal at the receiver.

15. The method of claim 10, wherein the optical signal is generated in accordance with a test pattern using circuitry on the chip.

16. The method of claim 10, further comprising coupling light from off the chip into the diagnostics waveguide.

17. A system for optical testing, the system comprising:
- a chip;
- a transmitter, wherein:
  - the transmitter is on the chip; and
  - the transmitter generates light;
- a receiver, wherein:
  - the receiver is on the chip; and
  - the receiver is an optical receiver;
- a photodetector; and
- a diagnostics waveguide, wherein the diagnostics waveguide optically couples light from the transmitter with the receiver and with the photodetector.

18. The system of claim 17, further comprising a branching coupler that couples the photodetector with the diagnostics waveguide, such that the photodetector is optically coupled with the transmitter.

19. The system of claim 17, wherein the chip is part of an undiced wafer.

20. The system of claim 17, further comprising a test circuit on the chip.

* * * * *